United States Patent
Clarke et al.

(10) Patent No.: US 7,443,164 B2
(45) Date of Patent: Oct. 28, 2008

(54) METHODS AND APPARATUS FOR MEASURING MAGNETIC FIELD HOMOGENEITY

(75) Inventors: Geoffrey D. Clarke, Boerne, TX (US); Hua-Hsuan Chen, San Antonio, TX (US); John W. Roby, III, San Antonio, TX (US); Rex D. Boykin, San Antonio, TX (US)

(73) Assignee: Board of Regents, The University of Texas System, Austin, TX (US)

( * ) Notice: Subject to any disclaimer, the term of this patent is extended or adjusted under 35 U.S.C. 154(b) by 0 days.

(21) Appl. No.: 11/593,765

(22) Filed: Nov. 7, 2006

(65) Prior Publication Data
US 2007/0164739 A1 Jul. 19, 2007

Related U.S. Application Data (60) Provisional application No. 60/735,286, filed on Nov. 10, 2005.

(51) Int. Cl.
*G01V 3/00* (2006.01)
(52) U.S. Cl. ........................... 324/318; 324/309
(58) Field of Classification Search ......... 324/300–322; 600/407–422
See application file for complete search history.

(56) References Cited

U.S. PATENT DOCUMENTS

| | | | | |
|---|---|---|---|---|
| 4,719,406 | A | * | 1/1988 | Schaefer et al. ............ 324/318 |
| 4,949,044 | A | * | 8/1990 | Starewicz et al. .......... 324/320 |
| 5,055,791 | A | | 10/1991 | LeRoux et al. ............. 324/318 |
| 5,706,811 | A | * | 1/1998 | Takeda et al. .............. 600/417 |
| 5,938,598 | A | * | 8/1999 | Takeda et al. .............. 600/409 |
| 6,409,515 | B1 | * | 6/2002 | Persohn et al. ............. 434/262 |
| 6,675,035 | B1 | | 1/2004 | Grable et al. .............. 600/411 |
| 6,992,280 | B2 | * | 1/2006 | White et al. ............. 250/252.1 |
| 7,157,696 | B2 | * | 1/2007 | White et al. ............. 250/252.1 |
| 2004/0254449 | A1 | | 12/2004 | Roopchansingh et al. ... 600/410 |

OTHER PUBLICATIONS

Jeffrey C. Weinreb, M.D., et al., "Magnetic Resonance Imaging (MRI) Quality Control Manual," 2001 pp. 92-94.
Strilka, et al., "A Numerical Study of Radiofrequency Deposition in a Spherical Phantom Using Surface Coils," Sep. 1998, pp. 1-12.
Roe, et al., "A Multipurpose MRI Phantom Based on a Reverse Micelle Solution (Abstract Only)," Jan. 1996, p. 1.

* cited by examiner

*Primary Examiner*—Brij B Shirvastav
(74) *Attorney, Agent, or Firm*—Trop, Pruner & Hu, P.C.

(57) ABSTRACT

In one embodiment, the present invention includes a method for obtaining magnetic resonance (MR) data of a phantom located in a magnetic resonance imaging (MRI) system with multiple bandwidths. The data may then be processed to determine magnetic field homogeneity of the MRI system.

23 Claims, 7 Drawing Sheets

METHODS AND APPARATUS FOR MEASURING MAGNETIC FIELD HOMOGENEITY

This application claims priority to U.S. Provisional Patent Application No. 60/735,286 filed on Nov. 10, 2005 in the name of Geoffrey D. Clarke, Hua-Hsuan Chen, John W. Roby, III, and Rex D. Boykin, entitled METHODS AND APPARATUS FOR MEASURING MAGNETIC FILED HOMOGENEITY.

FIELD OF THE INVENTION

The present invention relates to magnetic resonance imaging (MRI) and more particularly to measuring magnetic field homogeneity of an MRI system.

BACKGROUND

An MRI system is used to perform imaging on medical patients to ascertain details regarding internal structures. Typically, a portion of a patient is positioned within a large magnet. In addition to the main magnet, gradient magnets are further adapted within the MRI system to generate gradient fields. Then radio frequency (RF) energy is applied to a coil within the magnet to cause precession of protons within the patient based on the magnetic field conditions. When the RF energy is turned off, movement of the protons releases energy, which generates a signal that can be received and processed.

Main magnetic field ($B_0$) inhomogeneity is the fractional deviation of the local magnetic field from its average value over a specified diameter spherical volume (DSV). Poor main ($B_0$) magnetic field homogeneity (MFH) of an MRI system leads to artifacts and signal losses in MR images. Technical difficulties of creating a perfectly uniform field can cause poor MFH. Also, susceptibility differences within objects being imaged are a major source of MFH. Clinical application of magnetic resonance spectroscopy (MRS) data may be rejected if voxels are located near the sinuses or temporal bones and where poor MFH is demonstrated. Poor MFH also may lead to geometrical distortions of MR images or broaden the spectral linewidths in MRS. These distortions can be either spatial distortions, intensity nonuniformities or both. MRI pulse sequences that are sensitive to magnetic homogeneity include echo-planar imaging (EPI), true fast imaging by steady precession (trueFISP) and fast field echo (FFE) imaging methods. In cardiac MRI, gross motion, blood flow, and chemical shift artifacts from epicardial fat must all be managed, and thus a homogeneous static magnetic field is imperative.

It is often difficult to measure MFH for clinically deployed MRI systems in a manner that is time-efficient. For example, as part of an installation procedure, MRI service personnel may spend many man-hours evaluating MFH by placing a small sample in the magnet and determining its resonant frequency at hundreds of different locations. However, this process is time consuming and is only performed on installation.

The American College of Radiology (ACR) in its MRI Accreditation Program's Quality Control (QC) Manual describes two methods for measuring MFH: the spectral linewidth method (FWHM) and the phase difference ($\Delta\phi$) method.

For the linewidth method, the MFH is measured from the full width at half maximum (FWHM) of water peak of a phantom. The FWHM is converted from frequency in Hertz (Hz) to parts per million (ppm) using the following equation (for a proton spectrum):

$$FWHM(\text{ppm}) = FWHM(\text{Hz})/42.576 B_0(T) \qquad [\text{EQ.1}]$$

where $B_0$ is the main magnetic field strength. However, this method is only suitable for measuring MFH at a single DSV.

For the phase-difference ($\Delta\phi$) method, homogeneity maps are generated using a FFE sequence to acquire phase Fourier transformed images using two time-to-echo values, $TE_1$ and $TE_2$. Unwrapping and subtraction of the two-phase images is accomplished by a special image processing routine that is not generally accessible to a system operator. According to the ACR's MRI QC Manual, the greatest difference of $\Delta B_0$ divided by $B_0$ will give the MFH in ppm. Let $\Delta B_0$ (mT)=$B_0(0) - B_0(r)$, where $B_0(0)$ is measured at the isocenter and $B_0(r)$ is measured at a pixel located a distance, r, from the isocenter. Then $\Delta B_0$ (mT) can be calculated by using the phase difference $\Delta\phi$ (in radians) divided by the gyromagnetic ratio ($\gamma$=267,513 radians/mT for protons) and multiplied by the difference of the inverse of $TE_1$ and $TE_2$ in units of seconds as follows:

$$\Delta B_0 = \frac{\partial \varphi}{r}\left(\frac{1}{TE1} - \frac{1}{TE2}\right) \qquad [\text{EQ. 2}]$$

The $\Delta\phi$ method has found particular favor in research facilities that routinely perform functional MRI studies using blood-oxygen level dependent contrast. However, this method is often unavailable on a given MRI system.

Both of these methods are time-consuming, require significant operator expertise, and cannot be universally used in available MRI systems. Furthermore, these known methods can provide only limited information regarding MFH.

Accordingly, a need exists for an improved method of performing MFH that is suitable across MRI systems.

SUMMARY

In one aspect, the present invention includes a method for determining magnetic field homogeneity (MFH) of a MRI system. The method may be performed by acquiring MR data at two different bandwidths. Positional differences between the acquired data may then be used in a determination of MFH.

Furthermore, another aspect of the present invention resides in a phantom for use in such measurements. Specifically, a spherical phantom including multiple perpendicularly aligned plates having positional markers within may be provided. Using such a phantom, MFH may be determined at multiple DSVs using a single set of images.

DETAILED DESCRIPTION

In various embodiments, methods and apparatus are provided to enable measurement of MFH of various MRI systems. Such methods may be used to measure MFH in a rapid manner and further to enable such measurements across multiple diameters of spherical volume (DSV) within an MRI system. Furthermore, embodiments of the present invention may be used universally in any MRI system, as an apparatus and methods associated therewith can be adapted for use in a variety of systems.

In various embodiments, a bandwidth-difference ($\Delta$BW) method may be used for determining MFH. Such a method may be implemented using any of various excitation pulse sequences available with different MRI systems. Furthermore, using a phantom in accordance with an embodiment of the present invention, MFH may be determined at different DSVs using a singe set of images, to enable fuller evaluation of MFH.

Small bandwidth (BW) in the presence of poor MFH leads to geometric distortions because gradients are reduced to the level of the $B_0$ inhomogeneities. A $\Delta$BW method in accordance with an embodiment of the present invention compares the distortion for small and large BW acquisitions to determine the MFH. While the contours of what may be considered large and small bandwidths may vary, in many implementations a small bandwidth may be less than approximately 5,000 Hertz (Hz), while a large bandwidth may be greater than approximately 100,000 Hz. Of course in different systems, such as high field strength systems, the low bandwidth may be higher than 5,000 Hz, and conversely in lower field strength systems, the higher bandwidth may be less than 100,000 Hz. In different implementations, the ratio between the different bandwidths may vary from between approximately 1:5 to 1:20, although other ratios are possible.

Spatial distortion of the MR image depends on the MFH, and is also proportional to gradient strength, a fact that can be used to determine MFH. It may be assumed that the gradient field is linear, $B(x,y)=B_0+\Delta B(x,y)$, so that the main magnetic field, $B(x,y)$ is a vector sum of $B_0$ the dominating space-independent field, and $\Delta B(x,y)$ is the field inhomogeneity in mT over the DSV. Let $f_0$ correspond to the resonance frequency, $f_0=(\gamma/2\pi) B_0$, where $\gamma$ is the gyromagnetic ratio in Hz/mT. The linear magnetic field gradients used for imaging, in units of mT/m, are designated $G_x$, $G_y$, and $G_z$. For example, the linear magnetic field gradient along the x-axis in a conventional Fourier transform MRI is:

$$G_x = (2\pi/\gamma) \times (BW_x/FOV_x) \qquad [EQ.3]$$

where BW is the receiver bandwidth in Hz and FOV is the field of view in meters.

Also let $x'=x+\Delta B_0(x,y)/G_x$ be the amount of distortion in the image created by $\Delta B_0(x,y)$ which defines a new coordinate system $(x', y')$ in the x-y plane. The test proceeds by acquiring the first scan in which $BW_1$ (e.g., <5,000 Hz), so that $G_2 \sim \Delta B(x,y)$, and $x' \neq x$. and $\Delta B(x,y)/G_2 \approx 0$. For the second scan $BW_2$ is set to near its maximum value (e.g., $BW_2 \geq 125,000$ Hz) so that $G_2 >> \Delta B(x,y)$ resulting in $x' \approx x$ ($x'$ in units of meters). By placing $G_1$ and $G_2$ into $G_x$ in the new coordinate system and subtracting these two equations, we can obtain a distance difference $(x_1'-x_2')$ that is proportional to the MFH for a given DSV. Then dividing by $B_0$ the $B_0$-field homogeneity in ppm can be determined. In terms of the bandwidths used for each acquisition the MFH can be expressed as:

$$MFN \text{ (ppm)} = \frac{BW_1 \times BW_2 \times (x_1 - x_2)}{\gamma \cdot B_0 \cdot FOV \cdot (BW_1 - BW_2)} \qquad [EQ. 4]$$

where $\gamma\!\!\!/=\gamma/(2\pi)$. This measurement may then be repeated for a number of diameters at different orientations and in different planes throughout the phantom. Because changing the bandwidth may only produce distortion in the frequency-encoding direction, two images may be acquired at each bandwidth value in each imaging plane, with the direction of the phase-encoding and frequency-encoding gradients switched. The average of the values may be recorded at several positions at a given DSV and used to determine an overall MFH. In other embodiments, positional differences of corresponding landmarks at a common spherical volume may first be averaged and the resulting average may then be used in Equation 4.

As one example, if the distance between two points at $(x_1, y_1)$ and $(x_2, y_2)$ in the phantom is known to be $D_{true}$, then:

$$D_{true}=[(x_1-x_2)^2+(y_1-y_2)^2]^{1/2}. \qquad [EQ.5]$$

Assuming that the frequency encoding direction is the physical x-direction, then $\delta x1$ is the distance shift of $(x1, y1)$ in the image and $\delta x_2$ is the distance shift of $(x2, y2)$. Thus the distance in the phantom may be measured to be:

$$Dx=[(x1+\delta x1-x2-\delta x2)^2+(y1-y2)^2]^{1/2} \qquad [EQ.6]$$

and similarly for the case of the frequency-encoding direction being the physical y-direction:

$$DY=[(x1-x2)^2+(y1+\delta y1-y2-\delta y2)^2]^{1/2} \qquad [EQ.7]$$

In EQS. 6 and 7, $\delta x1$, $\delta x2$, $\delta y1$ and $\delta y2$ are the errors in the distance measured due to magnetic field inhomogeneities. By inspection, EQ. 5 can be subtracted from EQS. 6 and 7 to give the total measured displacement of the landmarks due to the magnetic field inhomogeneities. Using the assumption that geometric distortion only occurs in the frequency encoding direction:

$$\Delta total=[(Dx-Dtrue)^2+(Dy--Dtrue)^2]^{1/2}=[(\delta x1-\delta x2)^2+(\delta y1-\delta y2)^2]^{1/2} \qquad [EQ.8]$$

In principle, the quantity $\Delta$ total within an imaging plane can be determined from two images with the phase-encoding direction switched. However, the above discussion has assumptions. The first assumption is that no significant geometric distortion due to sources other than inherent magnetic field inhomogeneities exists. Second, the images may be assumed to have been acquired near the isocenter of the magnet to minimize the gradient field nonlinearities. In fact, there may be small additional distortions due to nonlinearities of the applied gradient fields and local magnetic susceptibility effects.

Figure 1:
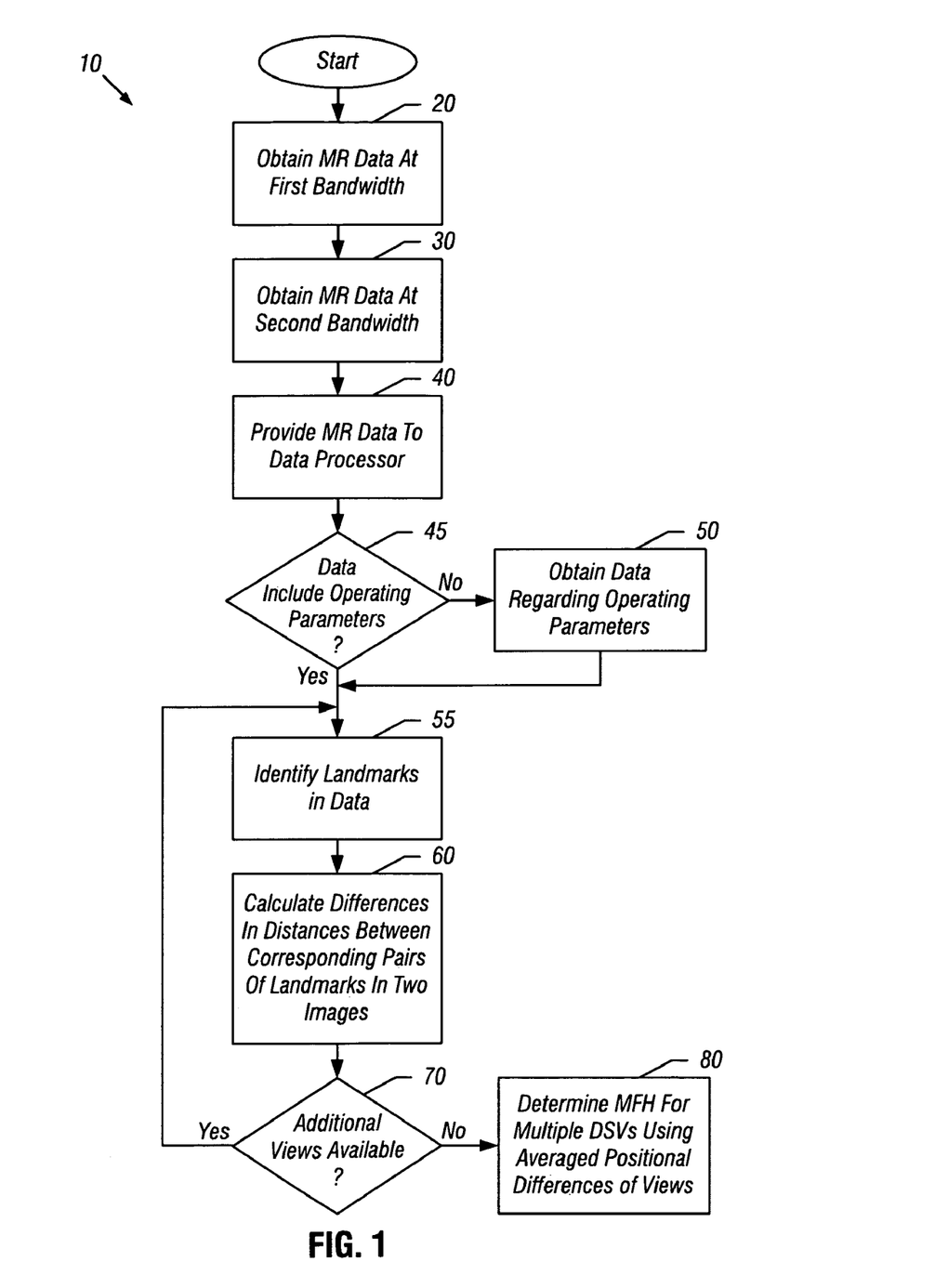
FIG. 1 is a flow diagram of a method in accordance with one embodiment of the present invention.

Referring now to FIG. 1, shown is a flow diagram of a method in accordance with one embodiment of the present invention. As shown in FIG. 1, method 10 may be used to acquire MR data and process the data to measure MFH. Furthermore, the MFH measurement may be performed at multiple DSVs, allowing more refined analysis of magnetic field issues and improved MRI performance, while using only a single set of images.

As shown in FIG. 1, method 10 may begin by obtaining MR data at a first bandwidth (block 20). In different MR systems, different pulse sequences are available. In some embodiments, a pulse echo sequence may be used, although the scope of the present invention is not so limited. The first bandwidth may correspond to a relatively low receiver bandwidth, as discussed above. The MR data may be acquired using a spherical phantom in accordance with an embodiment of the present invention located within the MRI tube. However, other phantoms may equally be used. The acquired data may be processed to obtain image data and be stored in the MRI system in a conventional manner.

Next, MR data may be obtained at a second bandwidth (block 30). This acquisition may be performed at a higher receiver bandwidth. While different bandwidth values may be used, in many implementations the difference between the bandwidths may range between a factor of approximately 5 and 20, although the scope of the present invention is not so limited. The acquired data from this bandwidth may also be processed and stored, as discussed above.

More specifically with regard to blocks 20 and 30, a single set of images may be acquired that are obtained according to different pulse sequences in multiple planes. For example, in one implementation two-echo images with a short TE (i.e., at a large receiver bandwidth) and a long TE (i.e., at a small receiver bandwidth) may be acquired in the axial plane with phase-encoding in the RL direction. Similar images also may be acquired in the axial plane, with the direction switched of phase-encoding and readout gradients. Next, two-echo images with a short TE (i.e., at a large bandwidth) and a long TE (i.e., at a small bandwidth) may be acquired in the sagittal plane, with phase-encoding in the AP direction. Similar images then may be obtained in the sagittal plane, switching the direction of phase-encoding and readout gradients. Still further, two-echo images may be acquired with a short TE and a long TE in the coronal plane, with phase-encoding in the RL direction. Finally in the coronal plane, similar images may be acquired, switching direction of phase-encoding and readout gradients.

Because only the receiver bandwidth is changed, the differences in distances between the two images may only appear in the frequency-encoding direction. In such manner, twelve images may be acquired in at least six scans for a full characterization of MFH. Using a fast gradient echo-type sequence, each scan may be performed in less than a minute in one embodiment, such that the whole data acquisition may be performed in approximately ten minutes, including set up time and a localizer scan.

Upon completion of data acquisition, the MR data may be provided to a data processor (block 40). For example, the data may be processed within the MRI system itself. Alternately, the data may be provided to a separate data processor, such as a personal computer (PC) or another computer system. The data may be provided in various formats, including different data image formats, such as DICOM, JPEG, proprietary files, or the like.

Next, it may be determined whether the MR data includes information regarding the operating parameters (diamond 45). That is, it may be determined whether the received data includes information regarding the MRI scanner, the pulse sequence applied, and various other operating parameters. If not, control may pass to block 50. There, this operating parameter data may be obtained (block 50). For example, a computer system may request such information from a user via one or more user interface windows.

Next, landmarks within the image data may be identified (block 55). For example, in various implementations, a software program executed on the computer system may automatically identify landmarks within the image data. These landmarks may correspond to positional landmarks of the phantom. For example, as described further below a phantom in accordance with an embodiment of the present invention may include multiple holes that appear as landmarks in the MR images. Note that the landmarks identified from the MR images may be identified automatically, by a software program. For example, a program may be adapted to search the acquired data for presence of information corresponding to positional landmarks. In some implementations, the program may include or be associated with a database that includes predetermined knowledge of the presence and location of positional landmarks within a phantom used for the imaging. Accordingly, the software program can compare image data to positional data of the positional markers to identify the location and presence of the known positional markers. Still further, the automatically-identified landmarks may be confirmed by a user, if desired.

After identifying the landmarks, differences in distances between corresponding pairs of landmarks in the two images may be calculated (block 60). That is, a first distance may be determined between two landmarks in the first image and a second distance may be determined between the same two landmarks in the second image. Then, a difference between these distances may be determined. In one embodiment, opposing landmarks on either side of an isocenter of a spherical phantom may be analyzed for positional differences. Because a phantom may include a plurality of such landmarks extending in a radially outwardly fashion, distances between multiple corresponding landmark pairs may be determined to obtain MFH information for different DSVs.

In one embodiment, the software program may include an algorithm to recognize each landmark based on relative pixel values, and then relate the pixel information to spatial information based on the field of view and pixel dimensions of the image. The distances between symmetrical clusters may then be output to a spreadsheet for further analysis. The collapse clusters may thus determine the brightest pixel in cluster groups. If adjacent pixels are the same pixel value, then the sum of all surrounding pixels is the deciding factor. If those are still the same, the pixels are averaged in position to get a sub-pixel position. Additionally, in some implementations, the program may be capable of sub-pixel accuracy as the spatial values are obtained by looking for the brightest pixels, or the center of the brightest cluster of pixels, which may be in between actual pixels.

Figure 2:
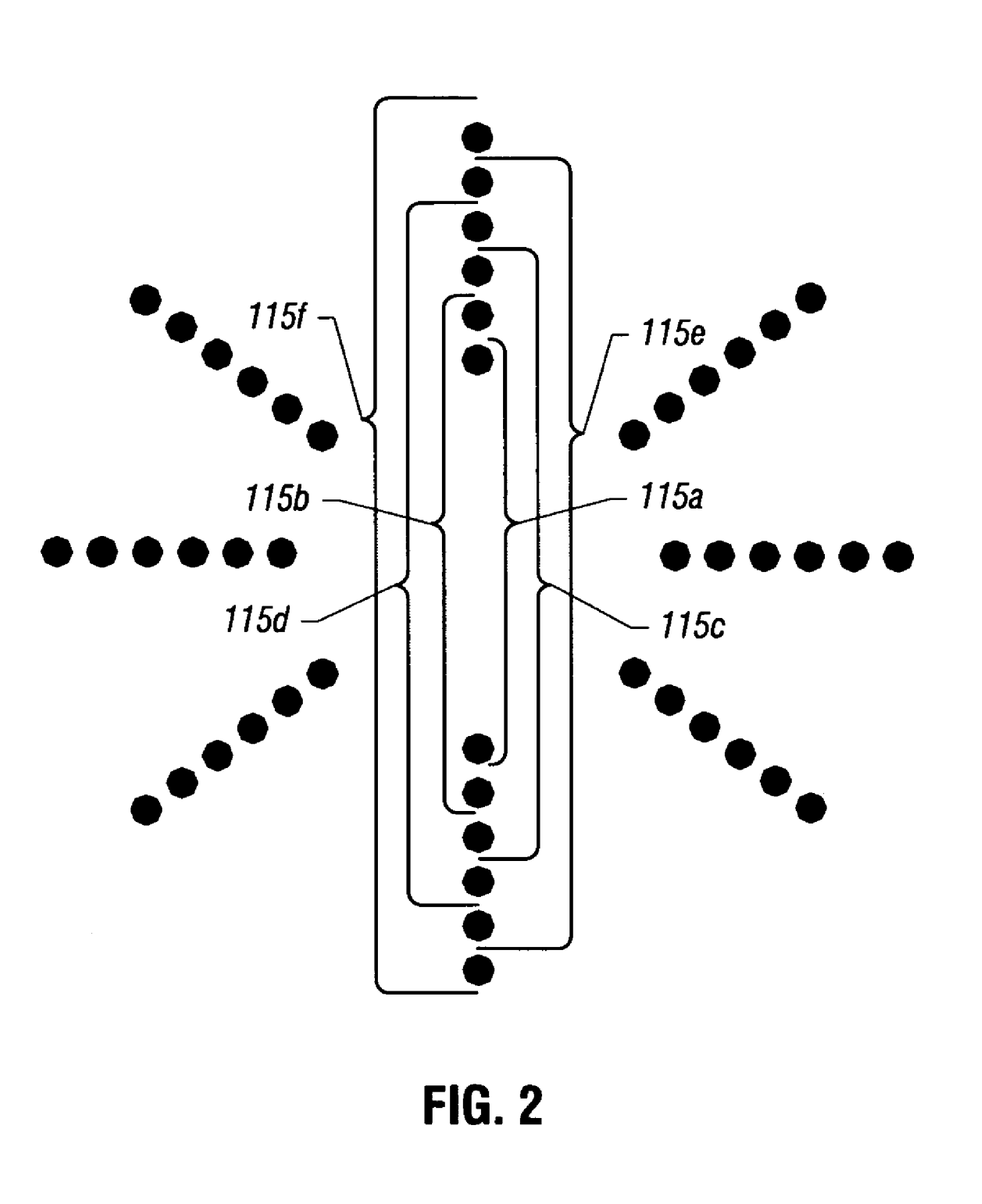
FIG. 2 is an illustration of a MR image obtained in a first view from a phantom in accordance with an embodiment of the present invention.

Referring now to FIG. 2, shown is an illustration of an MR image obtained in a first view (e.g., an axial view) from a phantom in accordance with an embodiment of the present invention. As shown in FIG. 2, a plurality of landmarks appear in radially outward fashion from an isocenter of the sphere. Shown for illustration in FIG. 2 are corresponding pairs 115a-115f. Each of these distances between corresponding pairs corresponds to a different DSV. While shown with this particular implementation in the embodiment of FIG. 2, it is to be understood that the scope of the present invention is not so limited. Furthermore, while only a single set of corresponding pairs are identified in FIG. 2, additional pairs are present as shown in FIG. 2. Specifically, FIG. 2 shows four such rows of corresponding pairs of landmarks. Thus in some implementations, multiple sets of landmarks at each of these distances from the isocenter may be analyzed to determine an average distance difference for a given DSV.

Referring back to FIG. 1, next it may be determined whether additional views are available (diamond 70). For example, using a phantom in accordance with an embodiment of the present invention, image data for axial, coronal and sagittal views may be available. If so, control passes back to block 55, discussed above. If instead no additional views are available, control passes to block 80. There, a MFH may be determined for multiple DSVs using averaged positional differences of the views (block 80). More specifically, in each view, multiple positional differences for corresponding pairs of landmarks at a given DSV may first be averaged. For example with reference back to FIG. 2, the average of four positional differences for each of the six DSVs may be determined. Then, equally averaged distance differences for the coronal and sagittal views, shown in FIGS. 3 and 4, may also be determined. Finally, an average of the positional differences of these three views may be averaged and used to obtain a single MFH value for each of multiple DSVs. Accordingly, in various embodiments MFH may be determined at multiple DSVs using a single set of images obtained at two different receiver bandwidths.

A method in accordance with an embodiment of the present invention may be implemented universally in any MRI scanner, allowing universality and uniformity in testing. While described with this particular configuration of testing and calculations in the embodiment of FIG. 1, it is to be understood that the scope of the present invention is not so limited, and in other embodiments different manners of calculating MFH from positional differences of corresponding landmarks can be performed.

Figure 5:
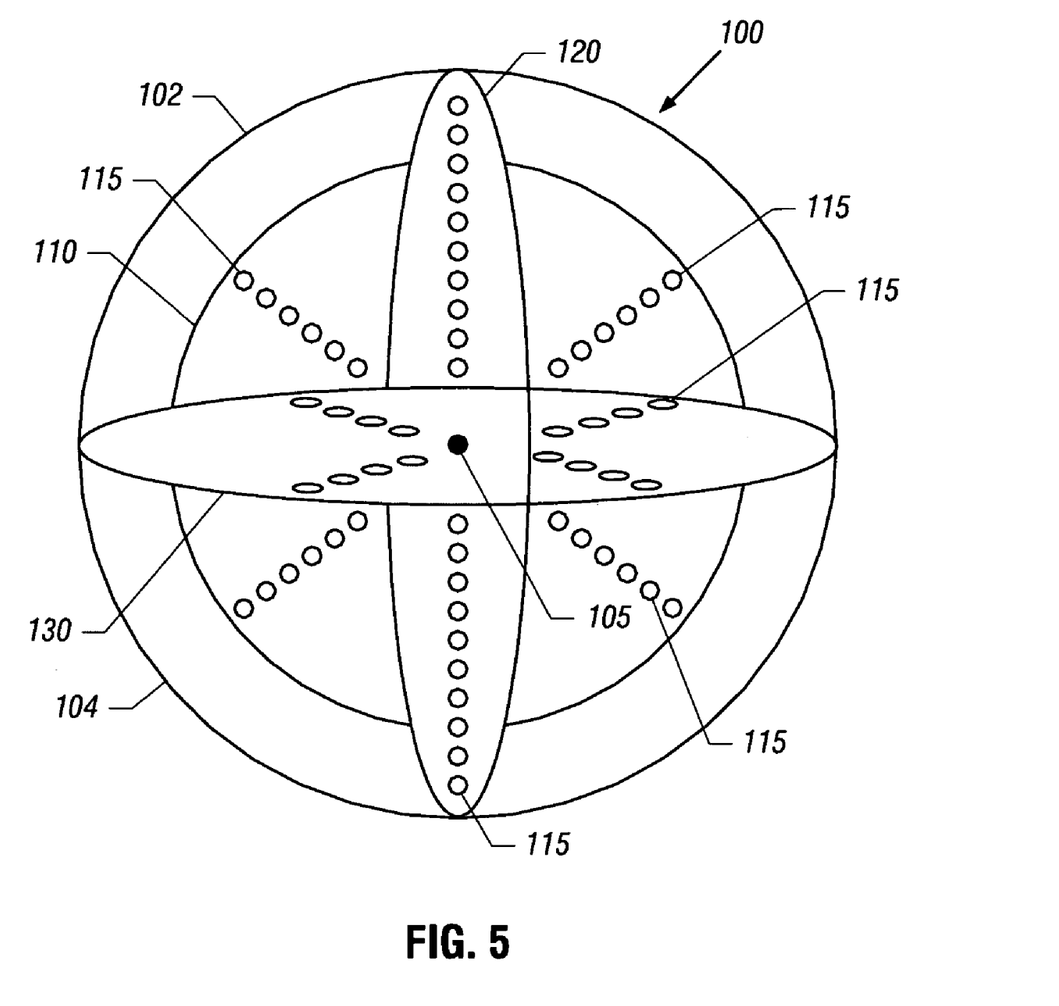
FIG. 5 is an isometric view of a phantom in accordance with one embodiment of the present invention.

Referring now to FIG. 5, shown is an isometric view of a phantom in accordance with one embodiment of the present invention. As shown in FIG. 5, phantom 100 is a spherical phantom formed of a pair of domes 102 and 104. Furthermore, inside the hollow sphere 100 are a plurality of plates 110, 120, and 130. As shown in FIG. 5, these plates may be perpendicularly arranged with respect to each other. Also shown in FIG. 5, each plate may include a plurality of positional markers 115. In some embodiments, these positional markers may correspond to circular holes within the plates, although other configurations such as square holes or other markings or indentations in the plates may be used instead. While shown with only a representative number of such positional markers in the embodiment of FIG. 5, it is to be understood that more or fewer markers may be present in different implementations. Furthermore, while FIG. 5 shows that the positional markers extend in a radially outward hub and spoke fashion from an isocenter 105 of sphere 100, other implementations are possible. For example, in some implementations additional positional markers such as cubes, squares, smaller plates, and the like may also be included within a phantom, as desired in a particular implementation.

Magnetic susceptibility issues can influence MR images from phantoms. Susceptibility effects are apparent at the interface of two materials and increase with $B_0$. Susceptibility differences cause localized image distortions, phase shifts and signal losses in MRI systems. With the increasing use of clinical high field MRI systems, a quality control (QC) phantom composed of materials that induce minimal susceptibility effects may be used.

In various embodiments, susceptibility uniformity can be optimized by constructing a phantom using a polymethylmethacrylate (PMMA) material, such as PERSPEX™ (also called PLEXIGLAS™ or acrylic), thus matching the phantom with the susceptibility of water of $-9.05 \times 10^{-6}$ in SI units. In other embodiments, tissue equivalent and other materials such as polyvinyl chloride (PVC), DELRIN™, high density polyethylene (HDPE), low density polyethylene (LDPE), nylon, acrylic, TEFLON™ polypropylene, polycarbonate, natorar rubber, sponge rubber, or ethylene propylene diene monomer (EPDM) rubber may be used.

A phantom in accordance with an embodiment may be spherical, since the magnetic field inside a sphere is influenced solely by the susceptibility of the medium outside. As used herein, the term spherical is understood to mean both a perfectly spherical shape, as well as a substantially spherical shape, such that the internal magnetic field is influenced only by external media. In an example implementation a spherical phantom (i.e., a substantially spherical phantom) such as that shown in illustration in FIG. 5 was assembled from two clear acrylic domes having an outer diameter of 10 inches, an inner diameter of 9 ½ inches and a thickness of ¼ inch (Global Plastics Services International, NB, Canada).

Figure 3:
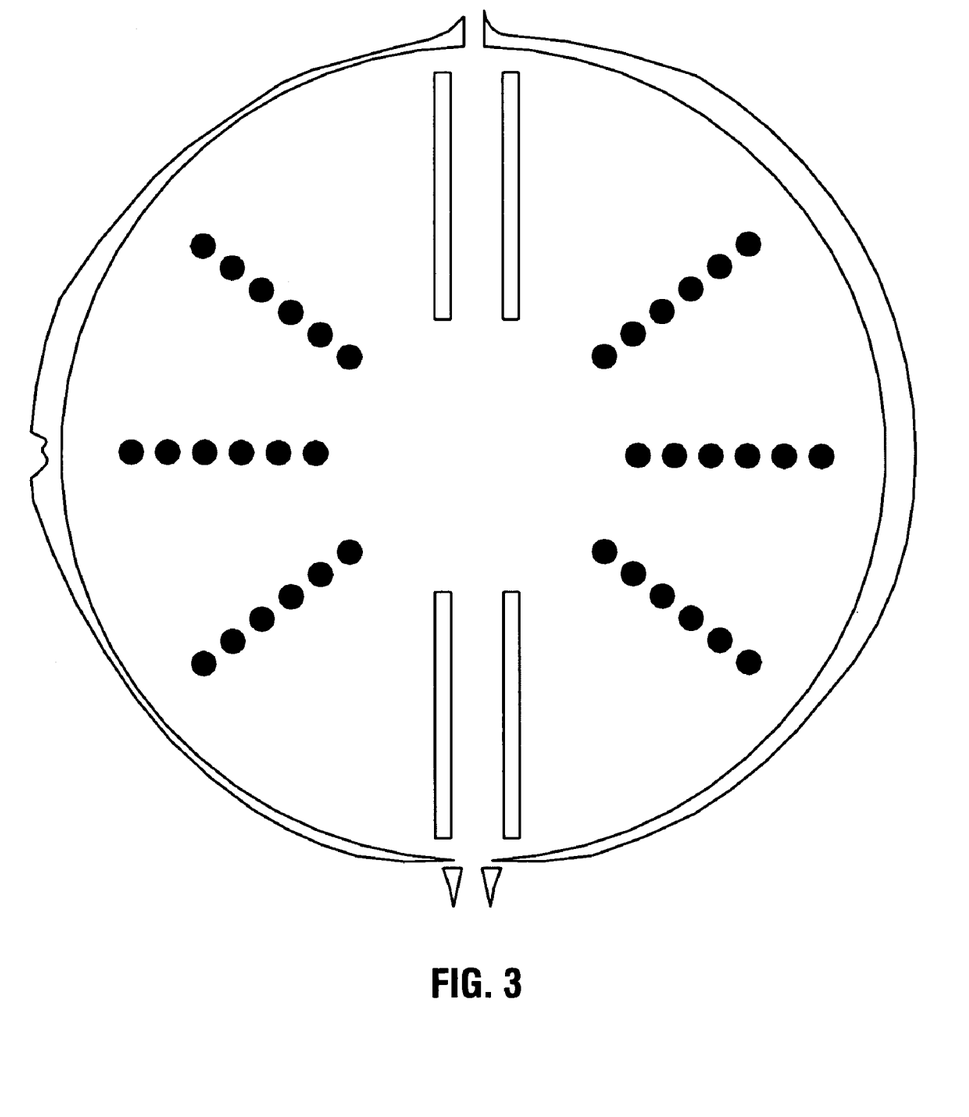
FIG. 3 is an illustration of a MR image obtained in a second view from a phantom in accordance with an embodiment of the present invention.
Figure 4:
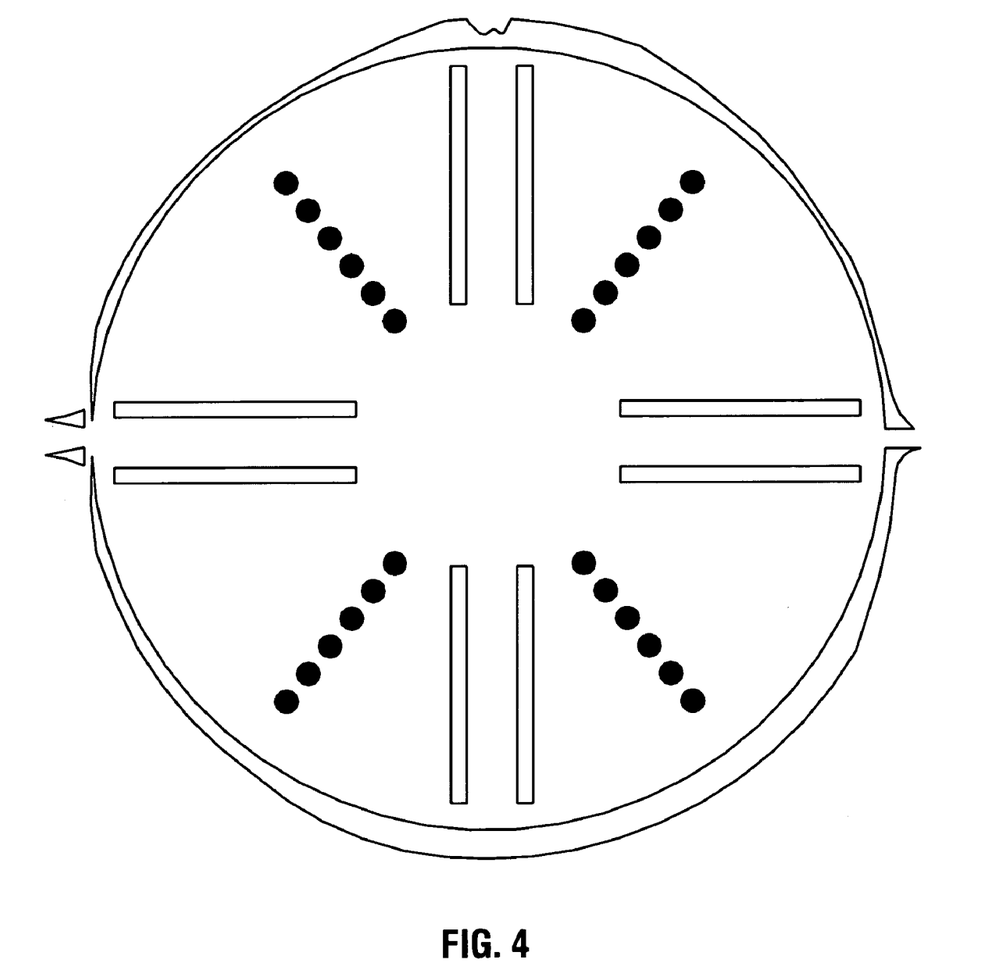
FIG. 4 is an illustration of a MR image obtained in a third view from a phantom in accordance with an embodiment of the present invention.

Inside the spherical phantom, there were three acrylic plates, each ½" inch thick, mounted and arranged perpendicular to each other with 108 holes of 1.5 mm diameter that were used as markers in all plates. The markers were designed to achieve good resolution. One plate had eight rows of markers that crossed at a 45° angle at the center with six holes in each row serving as position markers in the MR image as shown in FIG. 2 (i.e., in the axial plate). The sagittal plate included six rows of six holes, and the coronal plate included four rows of six holes, as shown in FIGS. 3 and 4, respectively. Holes in perpendicular plates show up as short lines of signal intensity.

In other embodiments, different arrangements of positional markers within a phantom may be implemented. For example, positional markers may be located at different locations on plates and there may be different amounts and/or sizes of positional markers, and further the markers may be of different shapes. Furthermore, the plates may be arranged at different orientations and may be sized differently in different embodiments.

The phantom may be filled with a paramagnetic solution to improve imaging. In the example implementation, the solution filling the phantom was sterile water doped with 0.01 mM $CuSO_4$ (to modify the T1 relaxation time) and $NaN_3$ 1 g $1^{-1}$ as an anti-bacterial agent. The chemicals inside the phantom may produce a single NMR signal peak that can be distinguished easily. Of course in other embodiments, other dissolvable agents to modify relaxation times such as salts of nickel or magnesium may be used.

In one experimental implementation, a phantom in accordance with an embodiment of the present invention was used to perform MFH analysis using the bandwidth difference method according to an embodiment of the present invention across a number of MRI systems. Data from the phantom were acquired using a body coil in a 3 Tesla whole-body MRI system (Trio, Siemens Medical Solutions, Malvern, Pa.), a 3 Tesla whole-body MRI system (Intera, Philips Medical Systems, Bothell, Wash.), a 1.9 T whole-body MRI system (GE/Elscint, Elscint Ltd., Haifa, Israel), a 1.5 T whole-body MRI system (Sigma LX,General Electric Healthcare, Waukesha, Wis.), a 1.5 T whole-body MRI system (Vantage, Toshiba America Medical Systems, Tustin, Calif.), a 1.5 T whole-body MRI system (Gyroscan Intera, Philips Medical Systems, Bothell, Wash.), a 0.35 T open MRI system (Opart, Toshiba America Medical Systems, Tustin, Calif.) and a 0.2 T open MRI system (Viva, Siemens Medical Solutions, Malvern, Pa.).

MFH measurements were made using a spherical phantom (i.e., a water solution-filled sphere) in accordance with an embodiment as described above. First, data were acquired using line width and phase-mapping methods (namely the line width method was performed on two machines and the Δφ method on one machine). Then a fast field echo pulse sequence (where available) was used for the ΔBW method.

For the FWHM pulse sequence, free induced decay (FID) data were acquired in a 3T scanner with a repetition time (TR) of 2,000 ms, echo time (TE) of 0.35 ms, flip angle of 90°, field of view (FOV) of 50 cm×50 cm, bandwidth of 1200 Hz, 16 NEX, no water suppression, $B_0$=2.89362 T, two step phase cycling and an acquisition time of 32 s. The center frequency was reset by adjusting the shim and then optimized by choosing the shimming parameters that produced the narrowest line width of water.

In the 1.5T Philips scanner, spectra were acquired using a single voxel sequence with TR=2,000 ms, TE=0.35 ms, flip angle of 90°, FOV of 17 cm×17 cm, BW=1,200 Hz, 16 NEX, no water suppression. Auto-shimming was used to adjust the width of the water peak.

For spectral peak linewidth measurements on a 3T MRI system, images were acquired using a scanner's shimming module. The MFH was measured from the FWHM of the water peak, 0.061 ppm @ 13.5 cm DSV using a spherical phantom; 0.268 ppm over a 19 cm diameter by 15 cm long right cylindrical phantom; and 0.067 ppm @ 27.9 cm DSV in a spherical phantom in accordance with one embodiment of the present invention.

The transverse relaxation time (T2) value of metabolite is inversely proportional to the ideal peak width and is a property of the material being used. The effects of transverse relaxation when combined with off-resonance effects (including those due to magnetic field inhomogeneities) are described by the time, $T2^*$, where $T2^* < T2$. The FWHM of the Lorentzian absorption spectral peak in Hz is defined as, $FWHM=1/(\pi T2^*)$, where $1/T2^*=1/T2+\gamma \Delta B_0$. It influenced MFH measurement when the linewidth method was used. In the 3 T scanner, the linewidth of the peaks were 19.1 Hz, 28.9 Hz, 45.7 Hz and 96.7 Hz as the $T2^*$ values became shorter. The FWHM method only provides a global assessment of the homogeneity in three dimensions and does not allow for acquiring the homogeneity in individual planes and restricts choice of DSV.

For the Δφ method, the phase shift maps acquired on the 3T scanner were performed using a gradient-echo pulse sequence with TR=200 ms, TE=10 ms for the short TE acquisition and TE=12.46 ms for the long TE acquisition, flip angle of 90°, FOV=(30 cm)$^2$, one slice, slice thickness =5 mm, $256^2$ matrix, BW=1048 Hz/pixel, no water suppression, $B_0$=2.89362 T and scan time =104 s.

Phase-difference maps, (Δφ), were processed using MEDx 3.4.3 (MEDX Medical Systems, Arlington Heights, Ill.) on all supported platforms (Windows, Solaris, Linux, Irix) to acquire the field map and unwrap the images. The phase difference (π to −π) was converted to intensity values (0 to 4095) in the original images. The maximum phase difference in intensity was subtracted by 2047 and then divided by 2048 and multiplied by π to convert the phase shift into units of radians, and then MFH was calculated in accordance with Equation 2, above. The Δφ images showed pronounced areas of poor MFH near the corners of the ACR phantom, which were not evident in spherical phantoms. For the Δφ method, phase reconstruction algorithms that unwrap the images are not available to system operators for all types and models of MR systems.

In the experimental embodiment, ΔBW images were acquired as three orthogonal images in various scanners with a fast field echo (FFE) pulse sequence, dual echo sequence (in which different TEs are used) and/or a spin echo sequence without water suppression. Of course, other pulse sequences may be used in accordance with embodiments of the present invention. The phantom was scanned twice in each system using two different bandwidths. It is noted that using a larger matrix size may increase precision of the measurement at the expense of SNR. All of the parameters used for data acquisition for the ΔBW method are listed in Table 1.

TABLE 1

| Parameter | site A | site B | site C | site D | site E | site F | site G | Site H |
|---|---|---|---|---|---|---|---|---|
| Magnetic Bo field strength | 0.2 T | 0.35 T | 1.5 T | 1.5 T | 1.5 T | 1.9 T | 3.0 T | 3.0 T |
| Manufacturer | Siemens Viva | Toshiba Opart | Philips Gyroscan Intera | Toshiba Vantage | GE Signa LX | Elscint Prestige | Siemens Trio | Philips Inera |
| pulse | SE/GE | FE | FFE | SE | Gre | SE | Gre | FFE |
| flip angle | /15 | 25 | 35 | | 25 | | 25 | 25 |
| TR(ms) | 500/6.5 | 160 | 49 | 200 | 51.6 | 300 | 49 | 40 |
| TE(ms) | 20/2.4 | | 10 | 21.6 | 8.5 | 16/90 | 8 | 9.2 |
| FOV(cm) | 300 | 300 | 300 | 300 | 300 | 300 | 300 | 300 |
| thickness (mm) | 10 | 10 | 6 | 6 | 6 | 6 | 6 | 5 |
| Matrix | 256 × 256 | 320 × 320 | 320 × 320 (rec: 512) | 320 × 320 | 256 × 256 | 320 × 320 | 320 × 320 | 320 × 320 |
| BW1 | 78 Hz/px | 24.41 Hz/px | 37 Hz/px (WFS = 6 pix) | 36 Hz/px | 15.8 Hz/px | 24735 Hz | 80(Hz/px) | 36.25 Hz/px (WFS = 12 pix) |
| BW2 | 260 Hz/px | 122.07 Hz/px | 448 Hz/px (WFS = 0.5 pix) | 224 Hz/px | 244 Hz/px | 15586 Hz | 1150(Hz/px) | 290 Hz/px (WFS = 1.5 pix) |
| scan time | 4:19 | 2:39 | 1:02 | 1:30 | 1:06 | 1:36 | 0:17 | 2:34 |

In implementing the ΔBW method, different MRI system manufacturers describe the bandwidth in different ways. For example, on General Electric scanners the bandwidth is specified in kHz for the whole FOV; the water-fat chemical shift (in pixels) is used for Philips MRI systems (224 Hz in 1.5 T system; 448 Hz in 3T system); and bandwidth/pixel (Hz/pixel) is used by Siemens. In this experiment, the chemical shift of the magnetic field divided by BW and multiplied by the frequency matrix was used on the Siemens scanner to convert BW-per-pixel to BW (Hz/FOV). BW was chosen by water fat shift (pixel) on Philips MRI systems, and chemical shift divided by the number of pixel was used to present the BW-per-pixel (Hz/pixel). In the 1.9 T MRI scanner used, bandwidth was not controllable. To measure the bandwidth used in a sequence, a phantom, containing contiguous compartments of with water and fat, may be scanned by a dual echo pulse to determine the chemical shift in the image in millimeters. Then the following equation may be used to calculate the bandwidth:

$$\text{Bandwidth (Hz)} = \frac{FOV \text{ (mm)} \times (3.5 \times 10^{-6}) \times \text{proton frequency (Hz)}}{\text{chemical shift (mm)}} \quad [\text{EQ. 9}]$$

With a 16 ms echo time (TE) image, the chemical shift is 4.6 mm; for a 90 ms TE image, it was 7.3 mm. From Equation 4, the BW's used in the experiment were 24735 Hz and 15586 Hz respectively.

For the ΔBW method, the MFH was measured from the difference in the positional shift of landmarks in the phantom between the two bandwidth acquisitions used in spherical coordinates in the axial view. This measurement was repeated for the sagittal and coronal views. In the example phantom described above, the MFH was measured from the positional shift from forty-eight points in the coronal view, thirty-six points in the sagittal view and twenty-four points in the axial view, as shown in FIGS. 2-4. A spherical coordinate system was used in which θ is defined as the azimuthal angle in the xy-plane from the x-axis with $0<\theta<2\pi$, ψ is the polar angle from the z-axis with $0<\psi<\pi$, and r is the radial distance from a point to the origin. Position shift was calculated by subtracting by the distances between the corresponding points across the center in the two different BW images for various DSVs.

In the experimental implementation, the coordinate locations were analyzed using a software program. Specifically, in the experimental implementation, MR data were obtained from the MR system and provided to a personal computer (PC) including a software program to analyze the data and determine positional differences between the images acquired with the different bandwidths. The software program further calculated MFH at different diameters of spherical volume based on the image data. The final results were then averaged across the different views obtained. Each landmark was recognized in spatial coordinate location from the imported image and then the distances between those paired corresponding landmarks were calculated and output into a spreadsheet.

Table 2 below shows MFH as measured by the three methods described herein across the eight MRI systems.

A ΔBW method measurement in accordance with an embodiment may be performed in different models and types of MRI systems. Such universality is an improvement over the FWHM method which has a volume selection limitation, and the Δφ method which may be unavailable on many machines. Moreover, a ΔBW method and phantom in accordance with an embodiment of the present invention produces measurements of MFH at various DSV values that can be obtained from a single set of phantom images. Further, images with different BWs can be acquired using either spin echo or gradient echo sequences in a short acquisition time. In contrast, resonant frequency mapping measurements would require many man-hours; the FWHM method has volume selection limitations; and the Δφ method, which generally needs a phase map pulse sequence and/or phase map reconstruction algorithms is available on few clinical MRI scanners.

Regarding the effect of phantom shape, the experimental data showed that a spherical phantom can produce better $B_0$ homogeneity compared to a cylindrical phantom. Furthermore, difficulties in shimming a short right rectangular cylinder such as a phantom used for ACR QC methods draw into question the use of such a phantom for MFH measurements. Phase difference images of the experiment showed pronounced areas of poor MFH, especially near the corners of the ACR phantom, which were not evident in the two spherical phantoms tested. Signal intensity loss is independent of the orientation. The field distortion is not only dependent on the tissue's permeability, but also on the shape of the objects, as well as orientation relative to that of the external magnetic field. Data of phase mapping in a 3T scanner showed that MFH changes with the orientation when adjustments in only one direction of gradients are made. The measurements of MFH by the ΔBW method may be limited by the pixel size, gradient nonlinearity and manufacturing variability. Shimming conditions, length of the magnet and diameter of the magnet vary with different MRI system models and manufacturers. In general, more homogeneous magnetic fields and better shimming may be achieved in long, cylindrical magnets. The sensitivity of the ΔBW measurement method may be higher with small pixel size or larger BW acquisitions.

To determine if the MFH measurements are limited by the pixel size, the $FOV_x$ may be presented by multiplying pixel size ($\Delta_x$) and $N_x$, matrix size ($N_x$) in the x-direction from EQ. 4 as:

TABLE 2

| Parameter | site A | site B | site C | site D | site E | site F | site G | Site H |
|---|---|---|---|---|---|---|---|---|
| Magnetic Bo field strength | 0.2 T | 0.35 T | 1.5 T | 1.5 T | 1.5 T | 1.9 T | 3.0 T | 3.0 T |
| Manufacturer | Siemens Viva | Toshiba Opart | Philips Gyroscan Intera | Toshiba Vantage | GE Signa LX | Elscint Prestige | Siemens Trio | Philips Inera |
| Length of magnet(m) | 1.142 | 2.12 | 1.78 | 1.4 | | 2 | 2.06 | 1.57 |
| Diameter of the magnet(m) | | 1.78 | 1.88 | 0.66 | | 0.5 | 1.36 | |
| MFH(ppm)by FWHM method | N/A | N/A | 0.1 | N/A | 0.58 | N/A | 0.23 | |
| MFH(ppm)byΔφ method | N/A | N/A | N/A | N/A | N/A | N/A | 0.27 | |
| MFH(ppm)byΔBW method | 6.7~12.9 | 2.7~5.5 | 0.8~1.3 | 0~0.6 | 0~0.2 | 0.6~1.0 | 0.1~0.3 | 0.06~0.14 |

$$H_B(x, y) = \frac{BW_1 \times BW_2 \times (x_1 - x_2)}{\gamma FOV_x(BW_2 - BW_1)} \quad \text{[EQ. 10]}$$

$$= \frac{1}{\gamma N_x} \frac{(x_1 - x_2)}{\Delta_x} \frac{BW_1 \times BW_2}{(BW_2 - BW_1)}$$

There are two situations that may arise in measuring the distance shift, $\delta_x$, in EQ. 8 due to $B_0$ inhomogeneities. One is that the distance shift is equal to or larger than the pixel size ($\delta_x = \Delta_x$), when it is measured in the direction of the gradients. The other is if the distance shift is equal to or larger than 1.41.x pixel size ($\delta x = \sqrt{2}\Delta x = 1.41\Delta x$), when it is measured along the diagonals. When the distance shift caused by the magnetic field inhomogeneities is less than in these two situations the MFH will be underestimated. Therefore, the error based on the pixel size could be between 0.1 pixel size/cm to 0.06 pixel size/cm ranges from 13 cm DSV to 22.6 cm DSV.

In theory, magnetic field strength affects the MFH. Spectral resolution (expressed as linewidth in Hz) is proportional to field strength. MFH within the sample decreases in high field strength systems because of increased susceptibility differences. However, MFH may be improved by optimized manual shimming, e.g., via high-order shims, such as up to third-order current bounded shims.

Embodiments of the present invention provide a methodology to effect a reliable quantification of MFH measurement using a generic phantom. In such manner, equipment performance can be easily assessed and the precision and accuracy of MRI image and MRS metabolite quantification can be measured. More so, the $\Delta$ BW method produces measurements of MFH at various DSV values that can be obtained from a single set of phantom images.

Figure 6:
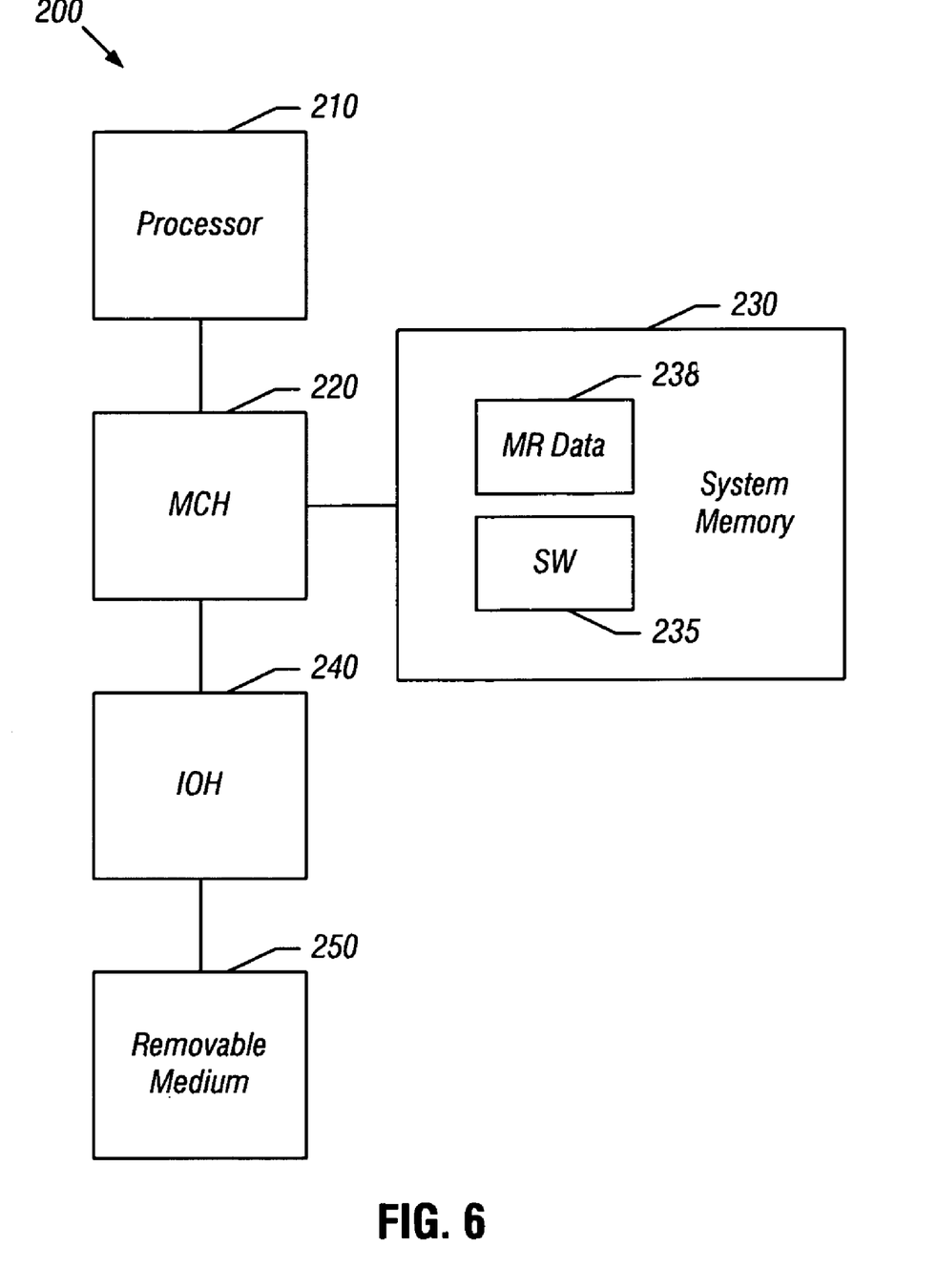
FIG. 6 is a block diagram of a system in accordance with one embodiment of the present invention.

In various embodiments, $\Delta$BW methods may be implemented in a software program, such as implemented in a computer-readable medium. Referring now to FIG. 6, shown is a block diagram of a system with which embodiments of the present invention may be used. System 200 may be a PC or other computer system. As shown in FIG. 6, a processor 210 is coupled via a memory controller hub (MCH) 220 to a system memory 230. As shown in FIG. 6, system memory 230 may include a software program 235 which may be adapted to execute instructions in accordance with method 10 described above with regard to FIG. 1 or a similar such method. Furthermore, system memory 230 may store MR data 238 which may be processed by software 235.

Still referring to FIG. 6, MR data 238 acquired by an MRI system may be input into system 200 via a removable medium 250, such as a diskette, CD-ROM, USB memory or any other such memory device. Removable medium 250 may be coupled through an input/output hub (IOH) 240 to MCH 220. In other embodiments, MR data may be electronically transmitted to system 200, e.g., via a local area network, Internet, or wirelessly, for example.

Furthermore, while shown in FIG. 6 as a PC-type architecture, it is to be understood the scope of the present invention is not so limited and in other embodiments, a server or an MRI system may be adapted to perform a bandwidth difference method and determine MFH in accordance with an embodiment of the present invention.

Figure 7:
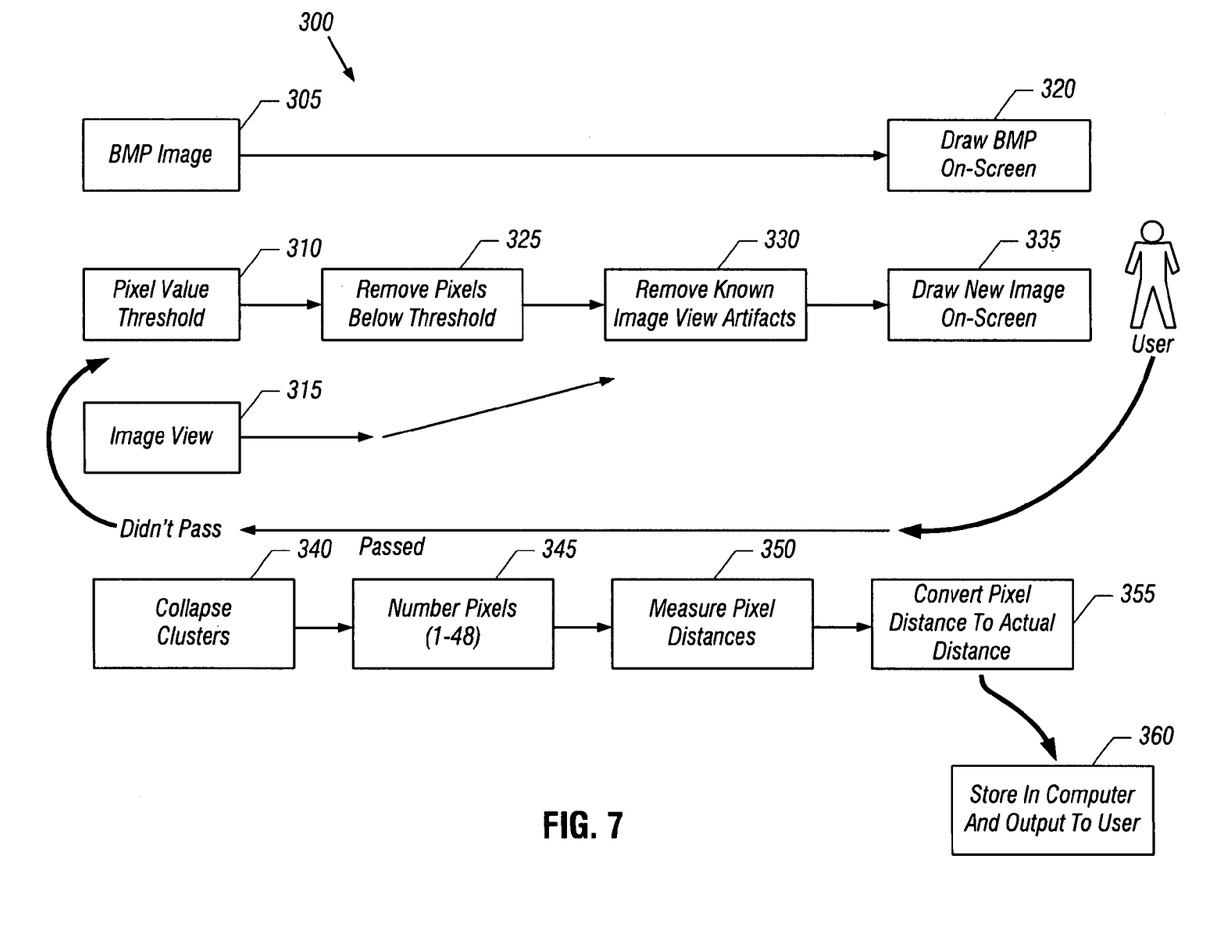
FIG. 7 is a block diagram of a software routine in accordance with one embodiment of the present invention.

Referring now to FIG. 7, shown is a block diagram of a software routine in accordance with one embodiment of the present invention. As shown in FIG. 7, software routine 300 may generate an image, i.e., a bit mapped image 305 converted from an MR scan. Furthermore, the software may receive input from the user, namely a pixel value threshold 310, which may be set at a cutoff value (e.g., from 0 to 255) and a selected image view 315 (i.e., an orientation of the images). The software routine may then draw an image on screen (320). This image may be formed with inverse coloring. Both pixels below the selected threshold and known image view artifacts may then be removed (325 and 330). After this processing, a new image 335 may be drawn on screen. Then a user may analyze the image to determine whether all landmarks are visible. If so, the user may indicate that the image passes. If instead all landmarks are not visible, user may indicate that the image does not pass, and new thresholds, e.g., may be selected.

If the image does in fact pass, the coordination of each landmark that is associated with a corresponding number may be identified and a pixel distance calculated. Specifically, any clustered pixels may be collapsed (340) and for each identified pixel (345) (e.g., numbers 1-48), associated pixel distances may be measured (350) and converted to actual distances (355) according to its matrix size. This converted distance information may be stored in a computer system and may be output to the user (360), e.g., via display or spreadsheet printout, for example. While shown with this particular implementation in the embodiment of FIG. 7, understand the scope of the present invention is not limited in this regard.

While the present invention has been described with respect to a limited number of embodiments, those skilled in the art will appreciate numerous modifications and variations therefrom. It is intended that the appended claims cover all such modifications and variations as fall within the true spirit and scope of this present invention.

Appendix 1

The following is a derivation of a bandwidth difference method for measuring magnetic field homogeneity in accordance with an embodiment of the present invention:

Let $B(x) = B0 + \Delta B(x)$, where $B(x)$ is magnetic main field & $\Delta B(x)$ is inhomogeneity in the frequency-encoding direction, x.

Let $$x' = x + \frac{\Delta B(x)}{G_x}$$

be the amount of distortion in the image created by $\Delta B(x,y)$.

So we examine two cases, $$x_1' = x + \frac{\Delta B(x)}{G_{x1}} \text{ and } x_2' = x + \frac{\Delta B(x)}{G_{x2}}$$

And assume that $G_{x1} \approx \Delta B(x)$ so that $x_1' \neq x$ and $G_{x2} >> \Delta B(x)$ so that $X_2' \approx X$.

Then subtracting $x_1'$ from $x_2'$, $$x_1' - x_2' = \frac{\Delta B(x)}{G_{x1}} - \frac{\Delta B(x)}{G_{x2}} = \Delta B(x)\left(\frac{G_{x1} - G_{x2}}{G_{x1}G_{x2}}\right)$$

Rearranging terms then, $$\Delta B(x) = \frac{G_{x1} G_{x2} (x'_1 - x'_2)}{(G_{x1} - G_{x2})} \quad [\text{EQ. A1}]$$

We have previously defined, $$G_x = \frac{2\pi}{\gamma} * \frac{BW}{FOV_x} = \frac{BW}{\gamma FOV_x} \quad [\text{EQ. 1}]$$

Substituting $G_{x1}$ and $G_{x2}$ and the position shift ($x'_1$-$x'_2$) into EQ. A1, $FOV_{x1}$=$FOV_{x2}$=$FOV_x$, $$\Delta B(x) = \frac{\frac{BW_1}{\gamma FOV_{x1}} \times \frac{BW_2}{\gamma FOV_{x2}} (x'_1 - x'_2)}{\left( \frac{BW_2}{\gamma FOV_{x2}} - \frac{BW_1}{\gamma FOV_{x1}} \right)}$$

Reducing, we obtain $$\Delta B(x) = \frac{BW_1 \times BW_2 \times (x'_1 - x'_2)}{\gamma FOV_{x2}(BW_2 - BW_1)},$$

which is in units of mT.

Dividing by magnetic field (in mT) and defining $\Delta B(X)$=$H_B(X)$, $H_B$ (in ppm) is obtained as, $$H_B \text{ (ppm)} = \frac{BW_1 \times BW_2 \times (x'_1 - x'_2)}{\gamma B_o FOV_{x2}(BW_2 - BW_1)} \quad [\text{EQ. A2}]$$

What is claimed is:

1. A phantom comprising:
a spherical structure having a hollow interior; and
a plurality of plates disposed within the hollow interior, at least three of the plates being substantially perpendicularly aligned, wherein each of the plurality of plates includes positional markers extending radially outwardly from a center of the plate in a hub and spoke manner,
wherein the phantom is a landmark system for measuring main magnetic field homogeneity of a magnetic resonance imaging system.

2. The phantom of claim 1, further comprising a solution within the hollow interior comprising water and copper sulfate.

3. The phantom of claim 1, wherein the positional markers comprise holes in the plates.

4. The phantom of claim 1, wherein the main magnetic field homogeneity is measured via a bandwidth difference method.

5. The phantom of claim 1, wherein the positional markers are located at a plurality of diameter spherical volumes.

6. The phantom of claim 1, wherein the spherical structure is formed of a pair of polymethylmethacrylate (PMMA) domes.

7. A method comprising:
obtaining first magnetic resonance (MR) data of a phantom located in a magnetic resonance imaging (MRI) system at a first bandwidth;
obtaining second MR data of the phantom located in the MRI system at a second bandwidth;
obtaining the first MR data and the second MR data with phase-encoding and frequency-encoding directions switched; and
processing the first MR data and the second MR data to determine magnetic field homogeneity (MFH) of the MRI system.

8. The method of claim 7, wherein processing the first MR data and the second MR data comprises determining a first positional difference between a first pair of common landmarks in the first MR data and the second MR data.

9. The method of claim 7, wherein processing the first MR data and the second MR data comprises determining a plurality of positional differences between respective ones of pairs of common landmarks in the first MR data and the second MR data, the pairs of common landmarks respectively located at different diameter spherical volumes.

10. The method of claim 9, further comprising determining the plurality of positional differences of multiple views of the first MR data and the second MR data.

11. The method of claim 7, wherein the first bandwidth is less than the second bandwidth by a ratio of at least 1:5.

12. The method of claim 8, further comprising computing the MFH from a predetermined equation using the first positional difference, the first bandwidth and the second bandwidth.

13. The method of claim 12, wherein the predetermined equation is $$MFH = \frac{BW_1 \times BW_2 \times (x'_1 - x'_2)}{\gamma \cdot B_o \cdot FOV(BW_2 - BW_1)}.$$

14. The method of claim 7, wherein the phantom comprises a spherical phantom including a plurality of plates perpendicularly aligned to each other.

15. The method of claim 7, further comprising receiving a threshold level from a user and processing the first MR data and the second MR data based on the threshold level.

16. A system comprising:
a processor to execute instructions; and
a memory coupled to the processor, the memory including instructions to determine main magnetic field homogeneity (MFH) of a magnetic resonance imaging (MRI) system at multiple diameter spherical volumes (DSVs) from a single set of MR images.

17. The system of claim 16, wherein the single set of MR images comprises at least one first image acquired at a first bandwidth and at least one second image acquired at a second bandwidth.

18. The system of claim 17, wherein the instructions are to automatically extract landmark data from the single set of MR images, the landmark data corresponding to landmarks of a phantom.

19. The system of claim 18, wherein the instructions are to compute the main MFH of a first DSV based on positional differences between common landmarks at the first DSV in the first image and the second image.

20. The system of claim 19, wherein the instructions are to average the positional differences between the common landmarks.

21. The system of claim 16, wherein the single set of MR images corresponds to pairs of images of multiple views, wherein the pairs of images are obtained at first and second bandwidths of the MRI system.

22. The phantom of claim 1, wherein the positional markers are located in rows, and each of the plurality of plates includes a different number of rows.

23. The system of claim 17, wherein the instructions are to acquire the at least one first image and the at least one second image with phase-encoding and frequency encoding directions switched.

* * * * *